United States Patent
Zhang

(10) Patent No.: US 7,808,304 B1
(45) Date of Patent: Oct. 5, 2010

(54) CURRENT SWITCH FOR HIGH VOLTAGE PROCESS

(75) Inventor: Hong Liang Zhang, Singapore (SG)

(73) Assignee: Marvell International Ltd., Hamilton (BM)

( * ) Notice: Subject to any disclaimer, the term of this patent is extended or adjusted under 35 U.S.C. 154(b) by 88 days.

(21) Appl. No.: 12/099,742

(22) Filed: Apr. 8, 2008

Related U.S. Application Data

(60) Provisional application No. 60/910,731, filed on Apr. 9, 2007.

(51) Int. Cl.
    *G05F 1/10* (2006.01)
(52) U.S. Cl. .................. 327/538; 327/539; 327/108
(58) Field of Classification Search .................. None
    See application file for complete search history.

(56) References Cited

U.S. PATENT DOCUMENTS

| | | | | |
|---|---|---|---|---|
| 7,215,180 | B2 * | 5/2007 | Nagata et al. | 327/538 |
| 7,352,216 | B2 * | 4/2008 | Hershbarger | 327/132 |
| 7,535,285 | B2 * | 5/2009 | Colman | 327/539 |
| 2009/0108919 | A1 * | 4/2009 | Ogiwara et al. | 327/539 |
| 2009/0206919 | A1 * | 8/2009 | Imtiaz | 327/539 |

* cited by examiner

*Primary Examiner*—Tuan Lam
*Assistant Examiner*—Hiep Nguyen

(57) ABSTRACT

In a current switch, a bias generation circuit electrically connected to a high voltage power supply generates a bias current. The bias current is mirrored by a current mirror containing a first plurality of transistors to a first one of a second plurality of transistors. The first one of the second plurality of transistors amplifies the mirrored bias current and transmits the amplified bias current to a second one of the second plurality of transistors. The second one of the second plurality of transistors sinks the amplified bias current into a node shared by an internal reference voltage, thereby putting the node in a first logic state. A third one of the second plurality of transistors receives the amplified bias current from the second one of the second plurality of transistors and sinks the amplified bias current into a node shared by a gate of a high voltage p-type transistor, thereby putting the node in the first logic state. Putting both nodes in the first logic state turns off the high voltage transistor.

15 Claims, 7 Drawing Sheets

CURRENT SWITCH FOR HIGH VOLTAGE PROCESS

CROSS-REFERENCE TO RELATED APPLICATIONS

The present application claims the benefit of the following U.S. provisional application Ser. No. 60/910,731, filed Apr. 9, 2007, entitled "Current Switch for High Voltage Process." The disclosure of the foregoing application is incorporated herein by reference in its entirety.

BACKGROUND

1. Field of the Invention

Aspects of the present invention relate generally to driver circuits used in CMOS integrated circuit (IC) design, and more particularly to a system and method of providing a current switch circuit to disable a driver circuit during a start-up period.

2. Description of Related Art

A driver circuit is an electrical circuit or electronic component used to control another circuit or component. Driver circuits are widely used in CMOS IC design, and may include circuits such as digital output buffers and power management driver circuits. To achieve, among other things, the switching or amplification characteristics commonly found in driver circuits, transistors, such as FETs and MOSFET, are employed. FIG. 1 illustrates an embodiment of an exemplary driver circuit. The exemplary driver circuit of FIG. 1 receives two inputs, a digital input DIN 100 and an enable signal EN 105, and produces an output signal OUT 145. The driver circuit operates using an internal power supply VDD 110. When the enable signal EN 105 is high, the driver is enabled. If digital input DIN 100 is high, PMOS transistor MP1 135 is turned on and NMOS transistor MN1 140 is turned off, and the output signal OUT 145 of the driver is high. If digital input DIN 100 is low, PMOS transistor MP1 135 is low and NMOS transistor MN1 140 is high, and the output signal OUT 145 is low. When the enable signal EN 105 is low, the NAND 115 and NOR 120 gates operate to block the input and disable the driver, the result of which is that transistors MP1 135 and MN1 140 are turned off.

The development of the bi-polar-CMOS-DMOS (BCD-MOS) integrated circuit process has enabled a low-cost solution to be formed from a combination of a high-voltage, low on-resistance ($R_{ON}$) switch with standard low-voltage 5V and 2.5V devices. Devices employing double-Diffused Metal Oxide Semiconductors (DMOS) may benefit from the BCD-MOS IC process by accepting high voltage power supplies while exhibiting fast switching during operation. In one embodiment, a device containing a DMOS transistor may enable a power supply of up to 18V to be used in a device.

FIG. 2 illustrates a cross section of an embodiment of an nDMOS device. DMOS devices allow relatively high drain-to-source breakdown voltages due to a lightly doped and extended drain region. In FIG. 2, the HV NWell 210 region of the DMOS device increases the drain-to-source breakdown voltage. A DMOS transistor achieves the high-drain-to-source breakdown voltage even though the DMOS gate oxide 240 is thin like a sub-micron CMOS device. The thin gate oxide yields a much lower $R_{ON}$*Area product for a 5V gate driver than a conventional high-voltage CMOS process, but at the expense of limiting the allowable $V_{GS}$ of the DMOS to 5V operation.

For certain driver circuits employing DMOS transistors, pre-driver circuits must be disabled during a start-up period to fully turn off an external transistor, such as a power MOSFET, being driven. If the external transistor being driven by a driver circuit is not turned off, the initial start-up current produced by the circuit's power supply in the circuit may damage the transistor. A conventional enable signal, such as shown in FIG. 1, cannot be used in these situations, however, due to the high breakdown voltage in the DMOS transistors contained in the driver circuit. Therefore, it may be desirable to provide a system and method that fully turns off the DMOS transistors in a driver circuit and the external transistor(s) being driven by the driver circuit to protect the external transistor being driven by the driver circuit from damage.

SUMMARY

Embodiments of the present invention overcome the above-mentioned and various other shortcomings of conventional technology, providing a system and method for disabling a driver circuit containing high voltage transistors during a startup period. A bias generation circuit electrically connected to a high voltage power supply may generate a bias current. The bias current is mirrored by a current mirror containing a first plurality of transistors to a first one of a second plurality of transistors. The first one of the second plurality of transistors may amplify the mirrored bias current and transmit the amplified bias current to a second one of the second plurality of transistors. The second one of the second plurality of transistors may sink the amplified bias current into a node shared by an internal reference voltage, thereby putting the node in a first logic state. A third one of the second plurality of transistors may receive the amplified bias current from the second one of the second plurality of transistors and sink the amplified bias current into a node shared by a gate of a high voltage transistor, thereby putting the node in the first logic state. Putting both nodes in the first logic state turns off the high voltage transistor.

The foregoing and other aspects of various embodiments of the present invention will be apparent through examination of the following detailed description thereof in conjunction with the accompanying drawing figures.

BRIEF DESCRIPTION OF THE DRAWING FIGURES

DETAILED DESCRIPTION

It will be appreciated from the following description that the driver circuit and current switch set forth herein may have utility in connection with driving a MOSFET or a power MOSFET for use in, among other things, power management, amplification, and switching applications.

Figure 1:
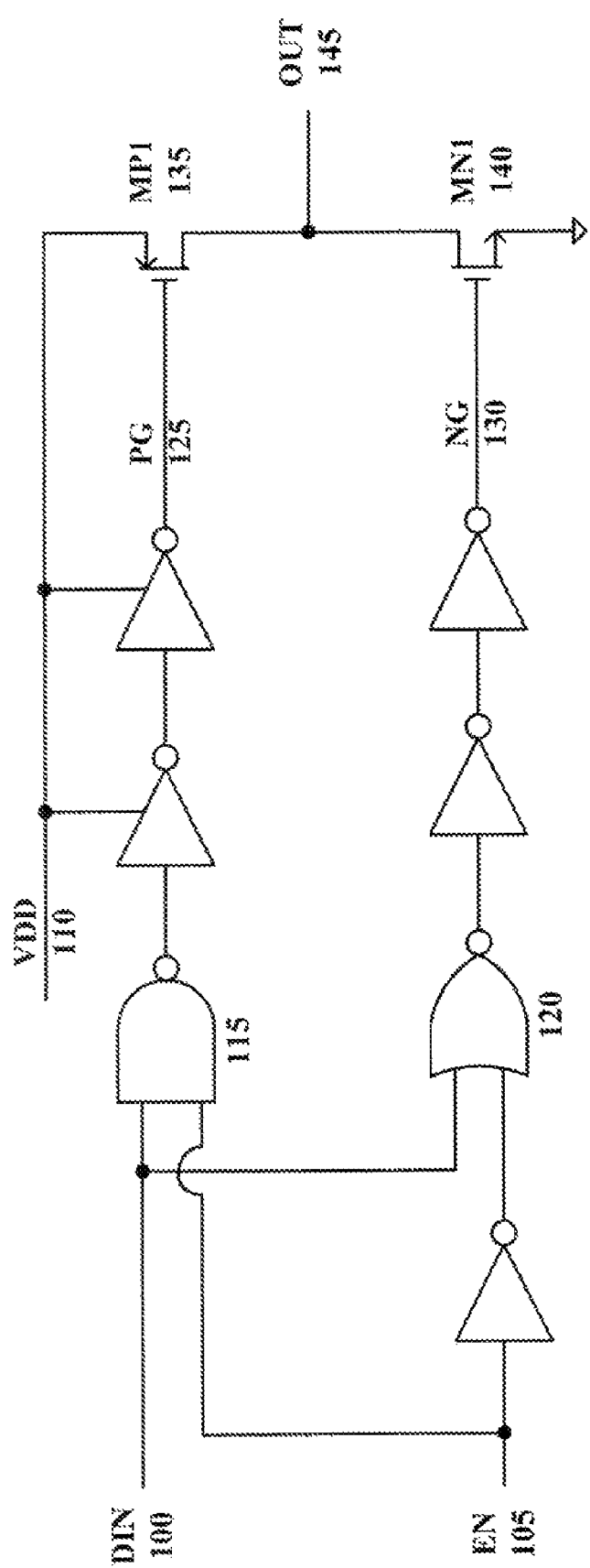
FIG. 1 is simplified diagram illustrating an embodiment of a driver circuit.
Figure 2:
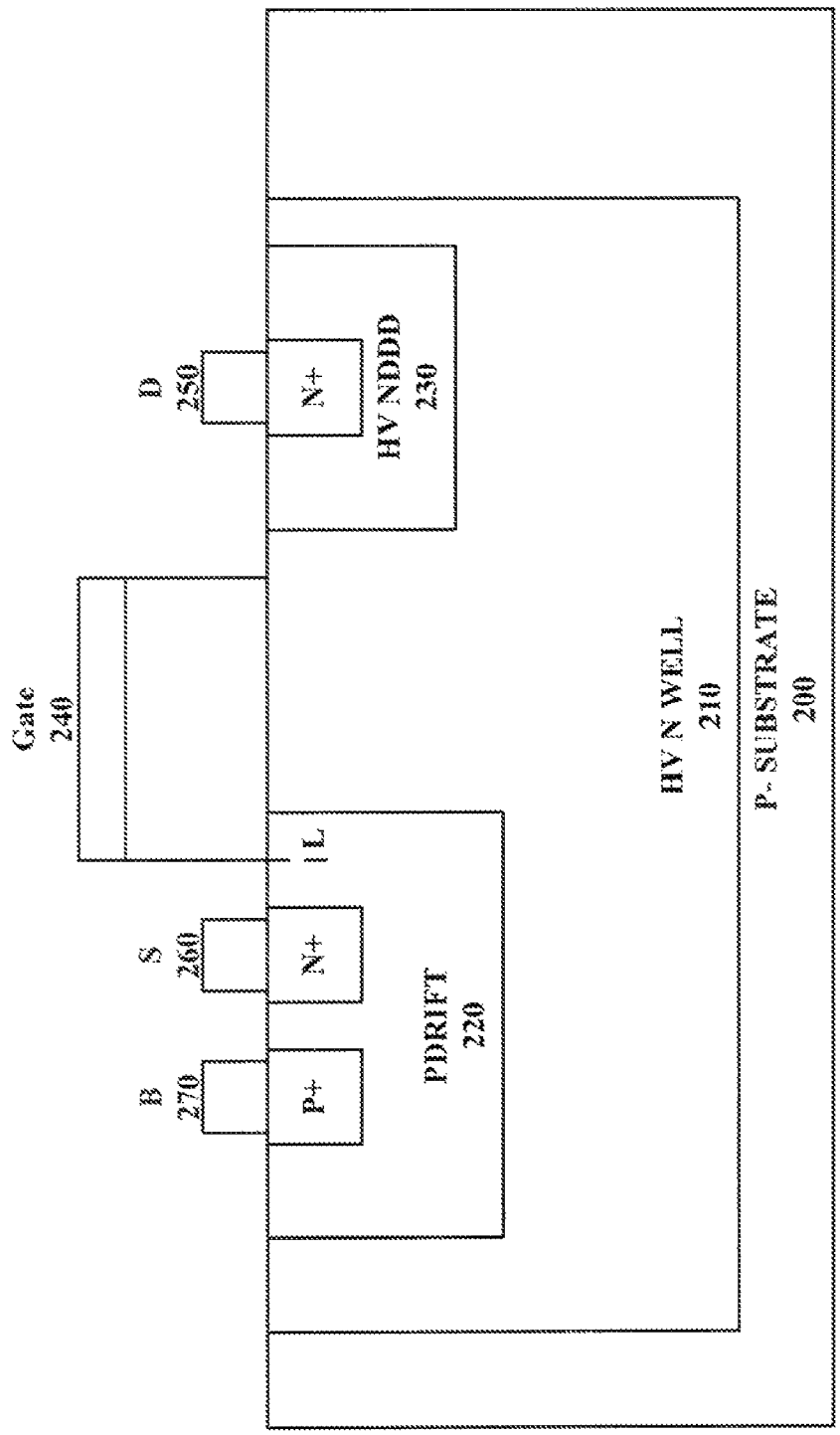
FIG. 2 is a diagram illustrating a cross-section of an embodiment of an n-type DMOS semiconductor device.
Figure 3:
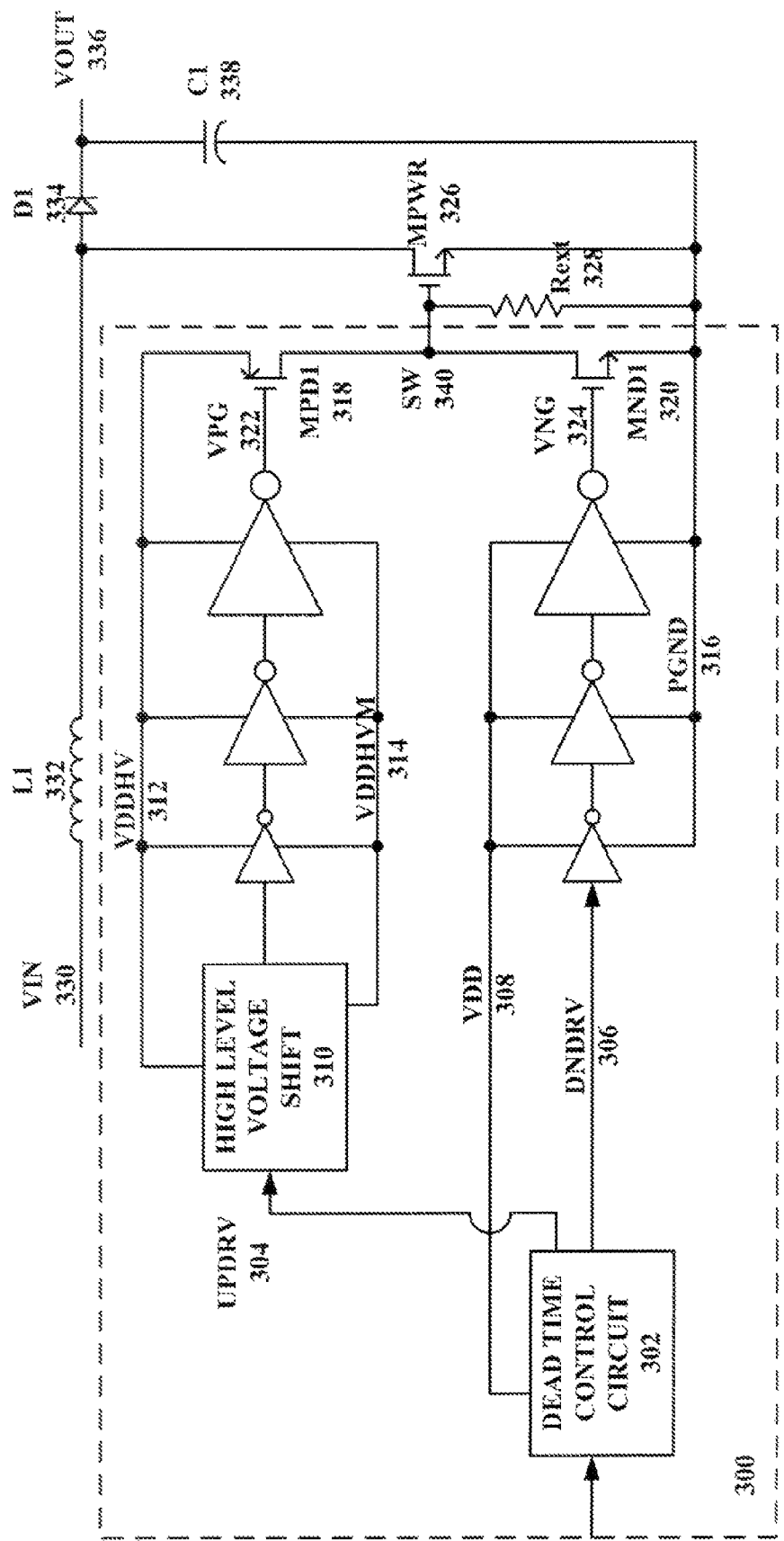
FIG. 3 is a diagram illustrating one embodiment of a power factor correction (PFC) control driver circuit.

By way of illustration, FIG. 3 is a simplified diagram illustrating one embodiment of a power factor correction (PFC) control driver circuit. The PFC driver circuit 300 is operable to drive an external power MOSFET or an insulated gate bi-polar transistor (IGBT), designated as MPWR 326. To drive MPWR 326, transistors MPD1 318 and MND1 320, which in this embodiment may be DMOS transistors, operate to control a node SW 340 electrically connected to the gate of MPWR 326. When MPD1 318 or MND1 320 is turned on, the node SW 340 is high, and the external power device MPWR 326 is turned on. If SW 340 is low, MPWR 326 is turned off. DMOS transistor MPD1 318 may be characterized by having a drain-to-source voltage $V_{DS}$ of up to 18V and a gate-to-source voltage $V_{GS}$ of 5V. The PFC driver circuit 300 also may include a high voltage power supply VDDHV 312 of up to 18V and a low voltage internal power supply VDD 308 of 5V. An internal reference voltage VDDHVM 314 can be provided as the difference between the VDDHV 312 and VDD 308 power supplies. The VDDHVM reference voltage 314 may be provided to the gate VPG 322 of MPD1 318 and used in conjunction with the VDDHV power supply 312 to maintain a 5V gate-to-source voltage $V_{GS}$ for MPD1 318. It should be readily apparent to one of ordinary skill in the art that use of an 18 volt high voltage power supply, a 5 volt internal power supply, and transistors characterized by a drain-to-source voltage $V_{DS}$ of up to 18V and a gate-to-source voltage $V_{GS}$ of 5V are merely exemplary and that these values may be varied as to vary the circuit configuration, while providing the same effect.

A dead time control circuit 302 may provide two signals, an updrive signal UPDRV 304 and a downdrive signal DNDRV 306, in response to an input signal. The updrive signal UPDRV 304 is fed to a high voltage level shifter 310 that operates to shift the signal to either the VDDHV or VDDHVM voltage levels depending on the value of the UPDRV signal 304. In one embodiment, when the input signal to the dead time control circuit 302 is logic low (e.g., zero), both the UPDRV 304 and the DNDRV 306 signals will be logic low. If UPDRV 304 is logic low (e.g., 0V), the high voltage level shifter 310 will shift the logic low signal from 0V to a high side logic low (e.g., VDDHVM). If UPDRV 304 is logic high (e.g., 5V for a circuit with a 5V power supply), the high voltage level shifter 310 will shift the logic high signal from 5V to a high side logic high (e.g., VDDHV). The DNDRV 306 is fed through a series of amplifiers to the gate VNG 324 of DMOS transistor MND1 320. The DNDRV signal 306 may take either a logic low value of 0V or a logic high value (e.g., 5V for a circuit having a 5V internal power supply). When the DNDRV signal 306 is high, the voltage at the gate VNG 324 of MND1 320 is equal to the voltage supplied by the internal power supply VDD 308 (e.g., 5V) and the MND1 transistor 320 is turned on, such that current flows from the source to the drain. When the DNDRV signal 306 is low, the MND1 transistor 320 is effectively turned off, such that little current flows from the source to the drain.

During a startup period of the PFC driver circuit 300, the internal power supply VDD 308 may not instantaneously supply its rated voltage. Rather, the internal power supply VDD 308 may need some time before it is ready to supply 5V to the driver circuit. Because the internal power supply requires a "warm-up" period before it supplies its rated voltage, the internal reference voltage VDDHVM 314, which relies on the internal power supply VDD 312 in generating its value, may be undefined. When the VDDHVM reference voltage 314 is undefined, there may be difficulty controlling the SW pin 340 as control of transistor MPD1 318 is dependent in part on the VDDHVM reference voltage 314. With an undefined VDDHVM reference voltage 314, transistor MPD1 318 may be open and the SW node 340 may be high. If the SW node 340 is high, the MPWR power device 326 may be turned on, resulting in a high current flowing through the inductor L1 332 to ground PGND 316, as input voltage VIN 330 is generally 110 or 220V and the inductor L1 332 may have an inductive resistance of, for example, 1 or 2 ohms. This current flowing through the inductor L1 332 to ground PGND 316 may damage the power device MPWR 326. Thus, for the scenario where a driver circuit starts up and the internal power supply VDD 308 of the driver circuit 300 is not ready to supply voltage, the transistors MPD1 318 and MND1 320 and the external power device MPWR 326 need to be turned off to prevent damage to MPWR 326.

Figure 4:
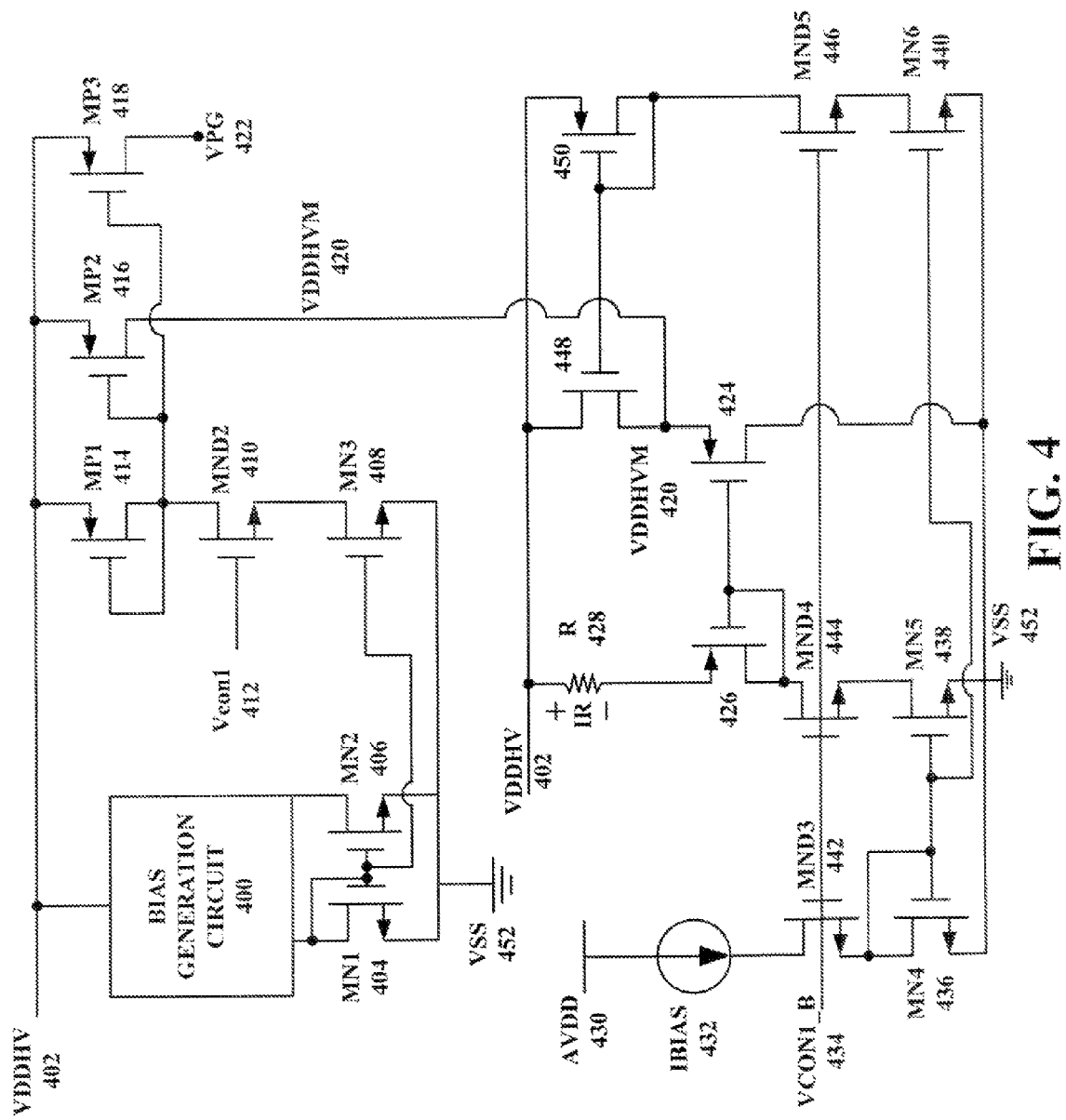
FIG. 4 is a diagram illustrating one embodiment of a current switch to disable pre-driver circuits during a startup period.

FIG. 4 illustrates a schematic of one embodiment of a current switch used during a start up period of a driver circuit. During start up of the driver circuit 300, the internal power supply VDD 308 may not be ready to supply its rated voltage, and as a result, internal reference voltage VDDHVM 420 may be undefined. The current supplied by internal reference voltage VDDHVM 420 may be expressed in FIG. 4 using AVDD 430 and Ibias 432. When current is ready to be supplied by Ibias 432, the current may be received by transistor MN4 436 and mirrored to transistors MN5 438 and MN6 440. In this respect, transistors MN4 436, MN5 438, and MN6 440 may operate as a current mirror. The drains of transistors MN4 436, MN5 438, and MN6 440 may be electrically connected to ground 452, while the sources of MN5 438 and MN6 440 may be electrically connected indirectly to the high voltage power supply VDDHV 402. A resistor R 428 may be electrically connected at one end to VDDHV 402 and at the other end to a two PMOS transistor buffer 424, 426 electrically connected at the drain of one of the PMOS transistors 426 to transistors MND4 444 and MN5 438 and at the source of the other PMOS transistor 424 to a node shared by internal reference voltage VDDHVM 420. The value of the resistor R 428 may be selected such that the voltage drop across the resistor 428 is equal to 5 volts. This 5 volt drop across resistor R 428 is equivalent to the 5 volt gate-to-source voltage $V_{GS}$ maintained across MPD1 318. However, when VDD 308 is not ready to supply voltage and MPD1 318 and MND1 320 should be turned off, both AVDD 430 and Ibias 432 may be zero, such that no current is supplied.

A bias generation circuit 400, electrically connected to the high voltage power supply VDDHV 402, may generate small amounts of biasing current. This biasing current may be received by transistor MN1 404, which together with transistors MN2 406 and MN3 408, operate as a current mirror. Transistors MN1 404, MN2 406, and MN3 408 may be n-type transistors. The biasing current received by MN1 404 from the bias generation current 400 may be mirrored to transistor MN3 408 through transistor MN2 406. At transistor MN3 408, the current may further be mirrored to transistors. MP1 414, MP2 416, and MP3 418 through transistor MND2 410. Transistors MP1 414, MP2 416, and MP3 418 may be p-type transistors having their respective drains electrically connected to the high voltage power supply VDDHV 402. As current is mirrored from MP1 414 to MP2 416, the current may be amplified at a ratio of 1:100, such that if a 1 µA current is received by MP1 414, a 100 µA current may exist at MP2 416. From MP2 416 to MP3 418, the current may be mirrored at a 100:100 ratio, such that the current through the circuit branch containing MP3 418 also is 100 µA. It should be readily apparent to one of ordinary skill in the art that the values of the currents flowing through transistors MP1, MP2, and MP3 need not be exactly 1 µA and 100 µA and the ratio of currents between these transistors need not be exactly 1:100 or 100:100. The current flowing through MP1, MP2, and MP3 also may not be DC currents, such that the values of the currents may not be precisely 1 µA or 100 µA, depending on the transistor. Use of these sample current values is merely illustrative.

The circuit of FIG. 4 may be designed in such a way that the circuit branch containing transistor MP2 416 may be electrically connected to a node shared by internal reference voltage VDDHVM 420. In this respect, the current received by transistor MP2 416 may be sunk into the node shared by reference voltage. VDDHVM 420. By sinking a roughly 100 µA current into the VDDHVM node 420, the VDDHVM node 420 may be pulled from an undefined state to a logic high state because the two PMOS transistor buffer 424, 426 is turned off in the absence of current flowing from AVDD 430 and Ibias 432. The circuit of FIG. 4 also may be designed in a way that the circuit branch containing transistor MP3 418 may be electrically connected to a node VPG 422 electrically connected to the gate of DMOS transistor MPD1 318. The current received by transistor MP3 418 from transistor MP2 416 may be sunk into node VPG 422, the result of which may be that the node VPG 422 is pulled to a logic high and the voltage at the gate of MPD1 318 is high (e.g., 18V).

Figure 5:
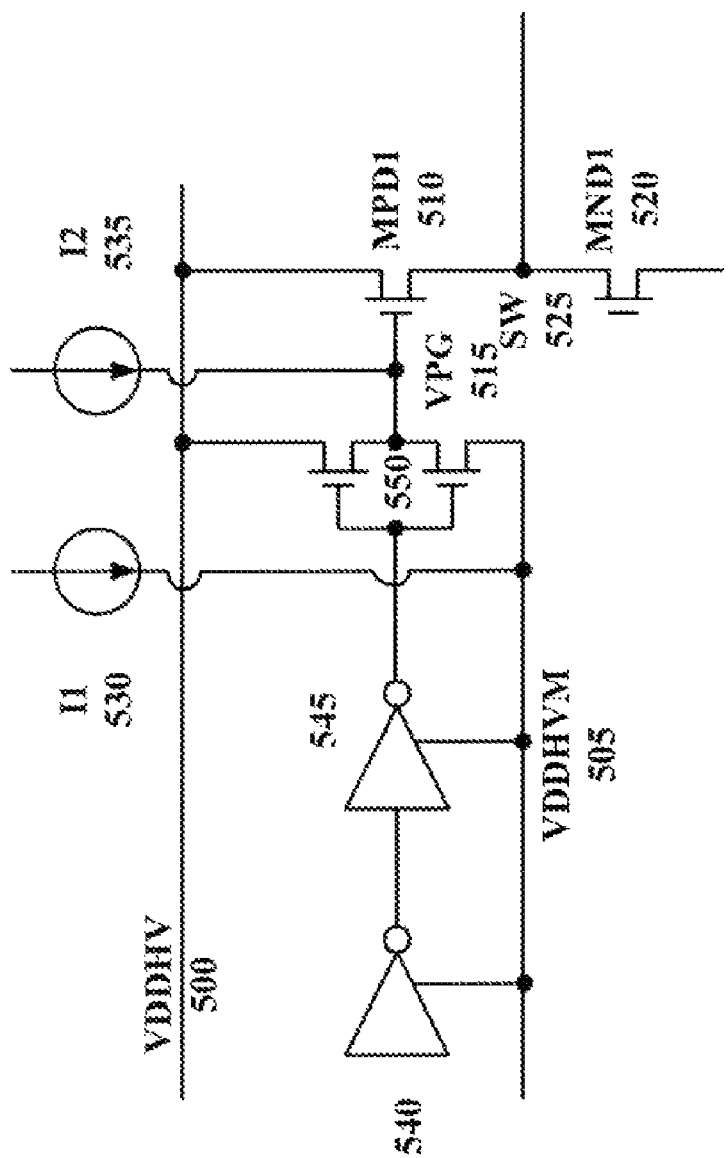
FIG. 5 is a diagram illustrating a portion of one embodiment of a current switch to disable pre-driver circuits during a startup period.

FIG. 5 illustrates a portion of one embodiment of a current switch to disable pre-driver circuits during a startup period. The current received by transistor MP2 416 in FIG. 4 may be alternatively viewed as a current source I1 530. The current from this current source may be sunk into a node shared by the internal reference voltage VDDHVM 505 to pull VDDHVM 505 to a logic high (e.g., 18V). Correspondingly, the current received by transistor MP3 418 in FIG. 4 may be alternatively viewed as a current source I2 535. The current from this current source may be sunk into a node VPG 515 which is shared by the gate of DMOS transistor MPD1 510. Sinking current into node VPG 515 may result in the node VPG 515 and the gate of MPD1 being pulled high (e.g., 18V). With both VDDHVM 505 and the gate of MPD1 510 pulled high, both nodes are shorted to the high voltage level VDDHV, and no current will flow from the drain to the gate of MPD1 510, as the breakdown voltage requirement for turning on MPD1 510 is not met. As a result, MPD1 510 will be totally turned off. Whether DMOS transistor MND1 520 is turned on or off is dependent on the internal power supply, which during a startup period of the PFC driver circuit 300, may not be ready to deliver its rated voltage. As a result, MND1 520 may be turned off during this period as well. With both MPD1 510 and MND1 520 turned off, the gate of the external power device MPWR 326 and the SW node 525 electrically connected to the gate of MPWR 326 may be turned off by external resistor $R_{EXT}$ 328, as shown in FIG. 3. In other words, any leakage current that may flow through the SW pin 525 to the gate of the external power device MPWR 326 may be routed through the external resistor $R_{EXT}$ 328 to ground PGND 316.

Figure 6:
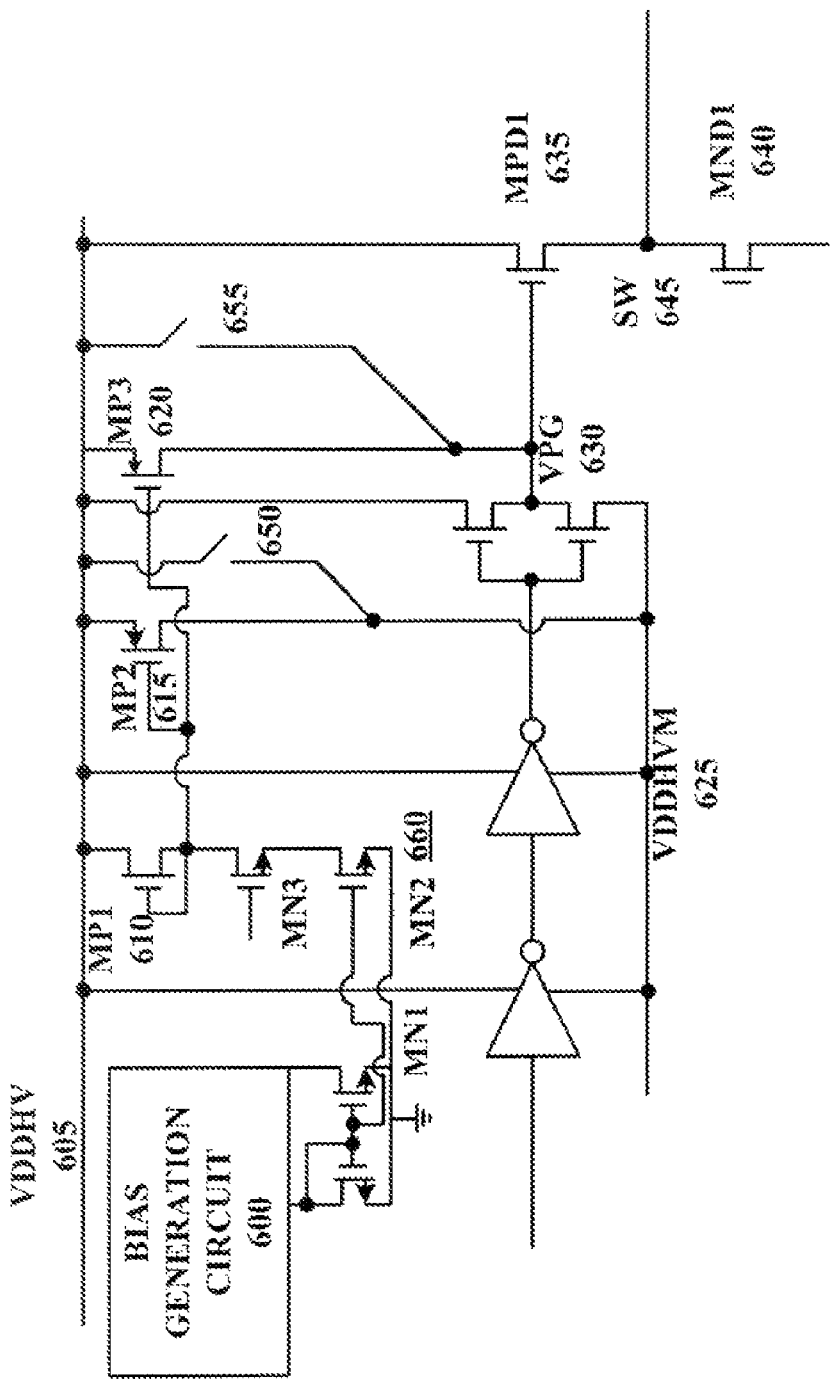
FIG. 6 is a diagram illustrating a portion of one embodiment of a current switch to disable pre-driver circuits during a startup period.

FIG. 6 illustrates a portion of one embodiment of a current switch to disable pre-driver circuits during a startup period. In the embodiment, a bias generation circuit 600 generates a bias current, which is mirrored through a current mirror 660 containing transistors MN1, MN2, and MN3. The current may be further mirrored to MP1 610. The current received by MP1 610 may be amplified to MP2 615 and MP3 620. The circuit branches containing transistors MP2 620 and MP3 630 may sink the amplified current received from MP1 610 into nodes VDDHVM 625 and VPG 630 respectively, resulting in both VDDHVM 625 and VPG 630 being pulled to a logic high state. Equivalently, sinking currents from the current branches containing transistors MP2 620 and MP3 630 to nodes. VDDHVM 625 and VPG 630 may be viewed as current switches 650, 655 which, if closed, pull the nodes VDDHVM 625 and VPG 630 to which the switches are connected to a logic high state. In one embodiment, the switches may be open during steady state operation of the driver circuit (i.e., when the internal power supply VDD 308 is supplying voltage) and may be closed during the start up period of the driver circuit when the internal power supply is not ready to deliver its rated voltage.

Figure 7:
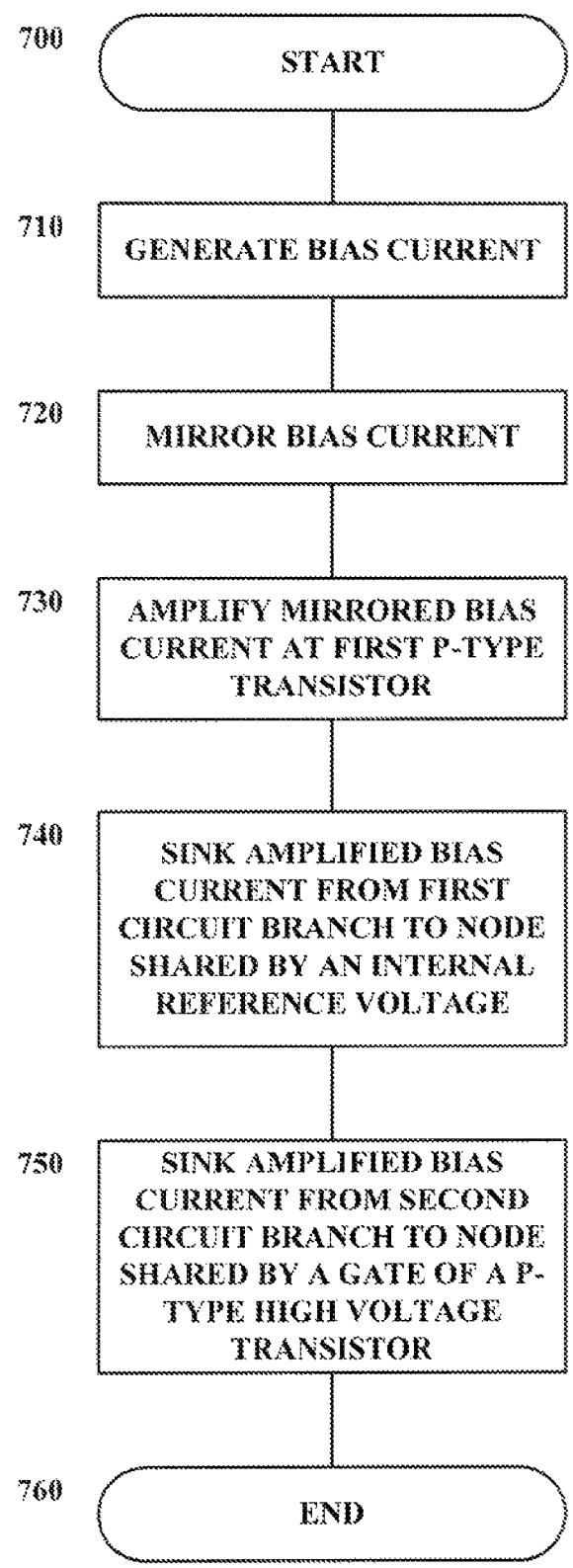
FIG. 7 is a simplified flowchart illustrating one embodiment of a method of disabling pre-driver circuits during a startup period.

FIG. 7 is a simplified flowchart illustrating one embodiment of a method of disabling pre-driver circuits during a startup period. In block 710, a bias current is generated by a bias generation circuit when a driver circuit is in a startup period. The startup period may be characterized by an internal power supply of the driver circuit failing to supply voltage to the driver circuit. The bias generation circuit may be electrically connected to a high voltage power supply that in one embodiment, may supply 18 volts. In block 720, the bias current generated by the bias generation circuit may be received by a current mirror. The current mirror may include a plurality of n-type transistors, with a first n-type transistor receiving the bias current from the bias generation circuit and mirroring the bias current to other transistors of the current mirror. In block 730, a first p-type transistor may receive the mirrored bias current. The gate of the first p-type transistor may be electrically connected to the gates of a second and a third p-type transistors. The first p-type transistor may amplify the mirrored bias current by an amplification ratio before transmitting the amplified current to the second p-type transistor. In one embodiment, the mirrored bias current received by the first p-type transistor may be approximately 1 µA. In one embodiment, the amplification ratio may be 1:100, such that if a 1 µA current is received by the transistor, a 100 µA current may be transmitted to the second p-type transistor. The values for the currents used in the embodiment herein, however, are merely exemplary.

In block 740, the amplified bias current may be received by a second p-type transistor. The source of the second p-type transistor may be electrically connected to a node in the driver circuit shared by an internal reference voltage VDDHVM. The internal reference voltage VDDHVM may be calculated as the difference between the voltage supplied by the high voltage power supply VDDHV and the voltage supplied by the low voltage internal power supply VDD. During a startup: period of the driver circuit, because the low voltage internal power supply VDD may not supply any voltage, the internal reference voltage VDDHVM may be undefined. The amplified bias current received by the second p-type transistor may be sunk into the node shared by reference voltage VDDHVM such that the VDDHVM node is pulled from an undefined state to a logic high state. In other words, the VDDHVM node may be shorted to the VDDHV level by sinking the amplified bias current from the second p-type transistor into the node shared by VDDHVM. The second p-type transistor may further transmit the amplified bias current to a third p-type transistor according to a 100:100 ratio, such that if 100 µA of current are received by the second p-type transistor, 100 µA of current may be received by the third p-type transistor.

In block 750, the amplified bias current received by the third p-type transistor may be sunk into a node VPG shared by a gate of a high voltage transistor MPD1. Transistor MPD1 may be a DMOS p-type transistor characterized, in one embodiment, by a drain-to-source voltage $V_{DS}$ of 18V and a gate-to-source voltage $V_{GS}$ of 5V. The effect of sinking the amplified bias current from the third p-type transistor to the node VPG shared by the gate of MPD1 may be that the gate of MPD1 is pulled to a logic high state. The effect of pulling both the VDDHVM and VPG nodes to logic high is that the gate and the source of transistor MPD1 are both shorted to the VDDHV voltage level, and the MPD1 transistor is turned off. A second transistor MND1 may be a DMOS n-type transistor having a source electrically connected to the source of transistor MPD1. Unlike transistor MPD1, transistor MND1 may operate using the internal power supply VDD and ground. During a startup period, internal power supply VDD may not supply any voltage, and accordingly, transistor MND1 also may be turned off. An external power device, such as a power MOSFET or IGBT, may be electrically connected to a node located between the source of MPD1 and the source of MND1. With both MPD1 and MND1 turned off, no current will drive the gate of the external power device, and as a result, the external power device may be turned off as well.

Several features and aspects of the present invention have been illustrated and described in detail with reference to particular embodiments by way of example only, and not by way of limitation. Those, of skill in the art will appreciate that alternative implementations and various modifications to the disclosed embodiments are within the scope and contemplation of the present disclosure. For example, the foregoing embodiments have been described using transistors of a particular type (e.g. n-type, p-type). It will be apparent that inputs and transistor types can be varied to as to vary the circuit configuration, while providing the same effect. Also, for example, the foregoing embodiments have been described with respect to DMOS transistors. It will be apparent that other transistors capable of operating at high voltages may be used instead, while providing the same effect. Therefore, it is intended that the invention be considered as limited only by the scope of the appended claims.

What is claimed is:

1. A current switch to disable a driver circuit during a startup period, the current switch comprising:
   a bias generation circuit electrically connected to a high voltage power supply to generate a biasing current during the startup period of the driver circuit in which an internal power supply fails to supply an internal voltage;
   a current mirror electrically connected to said bias generation circuit and a ground, comprising a first plurality of transistors electrically connected to each other to receive the bias current and output a mirrored bias current;
   a second plurality of transistors electrically connected to said current mirror and each other to receive the mirrored bias current, wherein a first one of said second plurality of transistors receives and amplifies the mirrored bias current according to a predetermined amplification ratio, and a second and a third one of said second plurality of transistors receive the amplified mirrored bias current,
   wherein a source of the second one of said second plurality of transistors is electrically connected to the high voltage power supply and a drain of the second one of said second plurality of transistors is electrically connected to a node shared by an internal reference voltage to sink the amplified mirrored bias current into the internal reference voltage node to put the internal reference voltage node in a first logic state,
   wherein a source of the third one of said second plurality of transistors is electrically connected to the high voltage power supply and a drain of the third one of said second plurality of transistors is electrically connected to a node shared by a gate of a high voltage transistor to sink the amplified mirrored bias current into the high voltage transistor gate node to put the high voltage transistor gate node in the first logic state, and
   wherein putting the nodes in the first logic state turns off the high voltage transistor.

2. The current switch of claim 1, wherein the high voltage transistor is a DMOS transistor.

3. The current switch of claim 2, wherein the high voltage DMOS transistor is characterized by a drain-to-source voltage of 18 volts and a gate-to-source voltage of 5 volts.

4. The current switch of claim 1, wherein during the startup period of the driver circuit, the internal power supply supplies zero voltage and the internal reference voltage is undefined.

5. The current switch of claim 1, wherein the high voltage power supply supplies 18 volts, the internal power supply supplies the internal voltage of 5 volts, and the predetermined amplification ratio is 1:100.

6. The current switch of claim 5, wherein the mirrored bias current has a value of 1 µA, the amplified mirrored bias current has a value of 100 µA, the first logic state has a value of 18 volts, and the internal reference voltage has a value of 13 volts.

7. The current switch of claim 1, further comprising:
   the internal power supply supplying the internal voltage and a corresponding internal current;
   a second current mirror comprising a third plurality of transistors to receive the corresponding internal current and provide a mirrored internal current;
   a plurality of DMOS transistors connected to an input signal;
   a buffer comprising a fourth plurality of transistors, wherein a drain of a first one of said fourth plurality of transistors is electrically connected to a drain of a second one of the plurality of DMOS transistors, a drain of a second one of said fourth plurality of transistors is electrically connected to the ground, and a source of the second one of said fourth plurality of transistors is electrically connected to the node shared by the internal reference voltage; and
   a resistor electrically connected to the high voltage power supply and a source of the first one of said fourth plurality of transistors, said resistor receiving the mirrored internal current and having a resistance value operable to cause a voltage drop across said resistor substantially equal to the voltage of the internal power supply.

8. A current switch to disable a driver circuit during a startup period, the current switch comprising:
   means for generating a biasing current during the startup period of the driver circuit in which an internal power supply fails to supply an internal voltage, said generating means electrically connected to a high voltage power supply;
   current mirror means electrically connected to said bias current generating means and a ground for receiving the biasing current and outputting a mirrored bias current;
   a transistor electrically connected to said current mirror to receive the mirrored bias current and output an amplified bias current amplified by a predetermined amplification ratio relative to the mirrored bias current;
   first current switching means electrically connected to said transistor for receiving the amplified bias current and sinking the amplified bias current into a node shared by an internal reference voltage to put the internal reference voltage node in a first logic state;
   second current switching means electrically connected to said first current switching means for receiving the amplified bias current and sinking the amplified bias current into a node shared by a gate of a high voltage transistor to put the high voltage transistor gate node in the first logic state;

wherein putting the nodes in the first logic state operates to turn off the high voltage transistor.

9. A method of disabling a driver circuit during a startup period, the method comprising:
- generating, via a bias generation circuit electrically connected to a high voltage power supply, a bias current during the startup period of the driver circuit in which an internal power supply fails to supply an internal voltage;
- mirroring the bias current through a current mirror;
- receiving, from the current mirror, the mirrored bias current at a first one of a first plurality of transistors and amplifying the mirrored bias current by an amplification ratio;
- sinking the amplified bias current from a first circuit branch including a second one of the first plurality of transistors to a first node shared by an internal reference voltage, wherein said sinking from the first circuit branch puts the first node in a first logic state; and
- sinking the amplified bias current from a second circuit branch including a third one of the first plurality of transistors to a second node shared by a gate of a high voltage transistor, wherein said sinking from the second circuit branch puts the second node in the first logic state;

wherein putting the first and the second nodes in the first logic state turns off the high voltage transistor.

10. The method of claim 9, further comprising responsive to turning off the high voltage transistor, turning off an external power device.

11. The method of claim 10, wherein the external power device is selected from the group consisting of a power MOSFET and an IGBT.

12. The method of claim 9, wherein during the startup period of the driver circuit, an internal power supply supplies zero voltage and the internal reference voltage is undefined.

13. The method of claim 9, wherein the high voltage power supply supplies 18 volts, the internal power supply supplies the internal voltage of 5 volts, and the amplification ratio is 1:100.

14. The method of claim 13, wherein the mirrored bias current has a value of 1 μA, the amplified mirrored bias current has a value of 100 μA, the first logic state has a value of 18 volts, and the internal reference voltage has a value of 13 volts.

15. The method of claim 9, wherein the high voltage transistor is a DMOS transistor characterized by a drain-to-source voltage of 18 volts and a gate-to-source voltage of 5 volts.

* * * * *